United States Patent [19]
Pottiger et al.

[11] Patent Number: 5,166,292
[45] Date of Patent: Nov. 24, 1992

[54] PROCESS FOR PREPARING A POLYIMIDE FILM WITH A PRESELECTED VALUE FOR CTE

[75] Inventors: Michael T. Pottiger, Bear; Brian C. Auman, Newark, both of Del.; John C. Coburn, Newton Square, Pa.; Timothy D. Krizan, Wilmington, Del.

[73] Assignee: E. I. Du Pont de Nemours and Company, Wilmington, Del.

[21] Appl. No.: 784,497

[22] Filed: Oct. 29, 1991

[51] Int. Cl.$^5$ .......................... B05D 3/02; C08F 2/00
[52] U.S. Cl. .................... 526/59; 427/372.2; 526/60; 526/61; 528/351; 528/353
[58] Field of Search .......................... 526/59, 60, 61; 427/372.2; 528/353, 351

[56] References Cited

U.S. PATENT DOCUMENTS 4,690,999  9/1987  Numata et al. ..................... 428/209
4,937,133  6/1990  Watanabe et al. .................. 428/209

FOREIGN PATENT DOCUMENTS 1245587  3/1988  Japan .

OTHER PUBLICATIONS

Han et al., Stress Build-Up in Thin Polyimide Films During Curing, *Antec* '88, pp. 994–996.

Primary Examiner—Morton Foelak

[57] ABSTRACT

Formation of polyimide film with a preselected coefficient of thermal expansion is disclosed employing relationships between cure temperature and heating rates.

10 Claims, 5 Drawing Sheets

PROCESS FOR PREPARING A POLYIMIDE FILM WITH A PRESELECTED VALUE FOR CTE

FIELD OF THE INVENTION

The present invention relates to a process for preparing a polyimide film having a preselected value for coefficient of thermal expansion (CTE). More particularly, it relates to the process in which a combination of chemical and processing factors is used to control the CTE.

BACKGROUND OF THE INVENTION

Polyimides constitute a class of valuable polymers characterized by high strength, thermal stability, inert character, and high $T_g$, among other properties. Polyimides find extensive use in electronic applications where they are useful in forming dielectric films in electrical and electronic devices such as motors, capacitors, semiconductors, printed circuit boards and other packaging structures. Typical uses for polyimides include protective and stress buffer coatings for semiconductors, dielectric layers for multilayer integrated circuits and multi-chip modules, high temperature solder masks, bonding layers for multilayer circuits, final passivating coatings on electronic devices and the like.

The increased complexity of the applications for polyimides, especially in the area of electronics, has placed a greater demand on the ability to tailor the properties of the polyimide for a specific application. Microelectronic devices often consist of multilayer structures with alternating layers of conductors (metals or semiconductors) isolated by layers of dielectric insulators (e.g., polyimides). The manufacture of these devices often involves a sequence of high temperature heating and cooling cycles. Stresses can be generated during these processes due to differences between the thermal expansion and moduli of the various layers of materials. These stresses may degrade the performance of the device and/or lead to premature device failure.

As electronic components become smaller, the control of stress becomes an even greater concern. A large part of the stress is related to the difference in the thermal expansion of the components. It is therefore desirable to be able to control the coefficient of thermal expansion (CTE) for dielectric materials so that it can be matched as closely as possible to the CTE's of other materials in the device.

Examples of high and low CTE polyimides have been disclosed in, for example, U.S. Pat. Nos. 4,690,999 and 4,137,933. However, it is frequently desirable to control the CTE more precisely and it is also necessary to take into consideration the other properties of the polyimide, e.g., electrical, mechanical and chemical properties. It therefore would be desirable to have a process for preparing a polyimide film having a preselected value for CTE.

SUMMARY OF THE INVENTION

This invention provides a process for making a polyimide film having a preselected value for CTE, said process comprising the steps:

(1) selecting a polyimide having a tetracarboxylic acid component and a diamine component according to the following criteria:

(a) when the preselected value for CTE is less than about 20 ppm/°C., both a major portion of the tetracarboxylic acid component and a major portion of the diamine component are rigid;

(b) when the preselected value for CTE is between about 20 and about 40 ppm/°C., a major portion of one of the components is rigid and a major portion of the other component is flexible;

(c) when the preselected value for CTE is greater than about 40 ppm/°C., both a major portion of the tetracarboxylic acid component and a major portion of the diamine component are flexible;

(2) preparing a polyimide precursor in a solution from the tetracarboxylic acid component and diamine component selected in step 1;

(3) experimentally correlating the change in CTE with cure temperature for a polyimide film made from the precursor in step 2, to determine a relationship between CTE and cure temperature, for at least one preselected cure heating rate;

(4) using said relationship to obtain a cure temperature and a heating rate for the polyimide film, and (5) preparing the polyimide film having the desired value for CTE from the polyimide precursor solution prepared in step 2 and using the cure temperature and the cure heating rate obtained in step 4.

In a second embodiment the invention provides a process for making a polyimide film having a preselected value for CTE, said film being made from a solution of a soluble polyimide.

DETAILED DESCRIPTION OF THE INVENTION

As used herein, the term CTE is intended to mean the in-plane CTE.

Polyimide films are usually manufactured in a two-stage process. The first stage is the preparation of a polyamic acid or a derivative of a polyamic acid, i.e., a "polyimide precursor," in solution. This is usually accomplished by a polycondensation reaction between a tetracarboxylic acid or its derivative, frequently the dianhydride, and a diamine in a suitable solvent. In the second stage, the polyimide precursor is converted chemically or thermally to the polyimide, i.e., imidized, by the removal of two molecules of water. The imidization step is frequently referred to as the "cure" step. In most cases, the resulting polyimide is highly insoluble in even strong solvents. Therefore, the solution of the polyimide precursor is generally fabricated into a film using solvent casting or spin coating techniques prior to the imidization step. In the case of soluble polyimides, imidization can take place prior to the fabrication step. The fabrication step is then followed by a bake step so that the film has the appropriate heat history.

To obtain a polyimide film having the preselected value for CTE a number of factors must be considered. These factors include the nature of the tetracarboxylic acid and diamine components; the film preparation method; the temperature at which the polyimide precursor is cured (the "cure temperature"), in the case of insoluble polyimides; the temperature at which the polyimide is baked (the "bake temperature"), in the case of soluble polyimides; and the heating rate at which the cure temperature or bake temperature is reached. The nature of the tetracarboxylic acid and diamine components determines the range of CTE values which can be obtained. The film preparation methods, drying conditions, and curing or baking conditions determine the value of the CTE from within that range.

The first step in the process of the invention is the selection of the tetracarboxylic acid component and the diamine component for making the polyimide precursor. As used herein, "tetracarboxylic acid component" is intended to mean the acid itself or any derivative which can be used to form a polyimide precursor, i.e., a polyamic acid or derivative of a polyamic acid. The tetracarboxylic acid component can consists of a single tetracarboxylic acid or derivative or a mixture of acids or derivatives. Similarly, the diamine component can be a single diamine or mixture of diamines. It is known that increasing the rigidity of either or both components, causes a decrease in the CTE of the resulting polyimide film. This relationship can be described as follows:

(a) when both a major portion of the tetracarboxylic acid component and a major portion of the diamine component are rigid, the CTE will be below 20 ppm/°C.;

(b) when a major portion of one component is rigid and a major portion of the other one is flexible, the CTE will be between 20 and 40 ppm/°C.;

(c) when both a major portion of the tetracarboxylic acid component and a major portion of the diamine component are flexible, the CTE will be above 40 ppm/°C.

The above categories are intended as guidelines for choosing appropriate polyimide compositions, and are not intended to imply that all polyimide films will always have CTE values which will fall within these ranges. However, to obtain a polyimide film having a preselected CTE, these guidelines provide an appropriate starting point.

By "rigid" it is meant that the component is essentially rod-like, such that it would tend to give the polymer an extended chain conformation. Examples of moieties which give rise to rigid components include 1,4-phenyl, 4,4'-biphenyl and 1,5-naphthalene, among others.

Examples of rigid tetracarboxylic acids which are suitable for use in the present invention include but are not limited to: dianhydrides like pyromellitic dianhydride, 1,4,5,8-naphthalene tetracarboxylic dianhydride, 2,3,6,7-naphthalenetetracarboxylic dianhydride, 1,2,5,6-naphthalenetetracarboxylic dianhydride, 3,3',4,4'-biphenyltetracarboxylic dianhydride, and 9,9-bis(trifluoromethyl)xanthene-2,3,6,7-dianhydride, and 9-phenyl-9-(trifluoromethyl)xanthene-2,3,6,7-tetracarboxylic dianhydride.

Examples of rigid diamines which are suitable for use in the present invention include but are not limited to: p-phenylene diamine, 4,4'-diaminobiphenyl, 4,4'-diamino-2,2'-bis(trifluoromethyl)biphenyl, 2-trifluoromethyl-1,4-phenylene diamine (2,5-diaminobenzotrifluoride), 4,4'-diamino-2,2'-dimethylbiphenyl, 4,4'-diamino-2,2'-dichlorobiphenyl, 4,4'-diamino-3,3'-dimethylbiphenyl, 2,5-dimethyl-1,4-phenylenediamine, 4,4'-diamino-2,2'-bis(trifluoromethoxy)biphenyl, 2-methyl-1,4-phenylene diamine, 2-chloro-1,4-phenylene diamine, 4,4'-diamino-3,3'-dimethoxybiphenyl, 4,4"-diaminoterphenyl, 4,4'''-diaminoquarterphenyl, 1,4-diaminobenzanilide, 2,5-diaminopyridine, 2,7-diaminofluorene, o-tolidine sulfone, 9,10-bis(4-aminophenyl) anthracene, and 1,5-diaminonaphthalene.

By "flexible" it is meant that the component contains a flexibilizing linkage or has a substantial bend or kink in the molecule, thus favoring a more random coil conformation of the polymer chain. Examples of moieties which give rise to flexible components include 1,2- or 1,3-substituted phenyl groups, 2,2',3,3'-substituted biphenyl groups and substituted diphenyl alkyls, ethers or sulfones.

Examples of flexible tetracarboxylic acids which are suitable for use in the present invention include but are not limited to: 3,3',4,4'-benzophenone tetracarboxylic dianhydride, 2,2-bis(3,4-dicarboxyphenyl) hexafluoropropane dianhydride, oxydiphthalic anhydride, 3,3',4,4'-diphenylsulfonetetracarboxylic dianhydride, and the like.

Examples of flexible diamines which are suitable for use in the present invention include but are not limited to: 4,4-diaminodiphenylether (4,4'-oxydianiline), m-phenylene diamine, 2,2-bis(4-aminophenyl)hexafluoropropane, 4,4'-methylenedianiline, 3,4'-diaminodiphenylether, and 1,4-bis(4-aminophenoxy)benzene.

The polyimide precursor may also be made from two or more tetracarboxylic acids and/or two or more diamines. The rigidity or flexibility of the tetracarboxylic acid component and diamine component will be determined by the rigidity or flexibility of the major portion of the component. By "major portion" it is meant greater than 50 mole percent and preferably greater than 60 mole percent. Thus a diamine component having 80 mole percent p-phenylene diamine (rigid) and 20 mole percent bis(4-aminophenyl) ether (flexible) would be considered to be substantially rigid. Higher levels of bis(4-aminophenyl) ether would increase the flexibility of the diamine component which would generally result in higher CTE values.

The next step in the process of the invention is to experimentally determine the relationship between CTE and the cure or bake conditions. In the cure step, a dried film of polyimide precursor is heated, increasing the temperature at a controlled heating rate to a cure temperature, i.e., a temperature at which imidization occurs, and the temperature maintained at the cure temperature for a time sufficient to ensure complete imidization of the precursor. In the bake step, a dried film of a soluble polyimide is heated, increasing the temperature at a controlled heating rate to a bake temperature and the temperature maintained at the bake temperature for specified time. The bake temperature is higher than the temperature for subsequent processing steps in order to prevent changes from occurring in the polyimide during that processing.

It has been found that both the rate at which the temperature is increased to the cure or bake temperature, i.e., the cure or bake heating rate, and the cure or bake temperature are important in determining the final CTE. In general, for slow heating rates, i.e., heating rates of 20° C./min or less, the CTE decreases with increasing cure or bake temperature, providing that the temperature is below the $T_g$ of the fully imidized polyimide. For fast heating rates, i.e., heating rates greater than 100° C./min, the CTE increases with increasing cure or bake temperature. At an intermediate heating rate, the CTE is independent of cure or bake temperature. Once this relationship is determined, it is possible to select the heating rate and the associated cure or bake temperature which will result in the preselected CTE.

The heating to cure or bake can be accomplished with a simple, continuous heating rate, i.e., the temperature is increased directly to the cure or bake temperature at the heating rate. Alternatively, a complex, discontinuous heating rate can be used whereby the film is heated to an intermediate temperature at the heating rate, the temperature maintained at the intermediate temperature for a specified time period, and then the temperature again raised at the heating rate until the cure or bake temperature is reached. A single intermediate temperature can be used or more than one intermediate temperature. It is also possible to use different heating rates for the different stages in the heating cycle, although generally, the heating rate will be the same in each stage.

In general, a multiple stage heating cycle, i.e., one having a discontinuous heating rate in which the film is heated to at least one intermediate temperature and maintained at that temperature before heating to the cure or bake temperature, results in a film with a CTE which is less than or equal to the CTE of a film which is heated directly to the cure or bake temperature.

Figure 1:
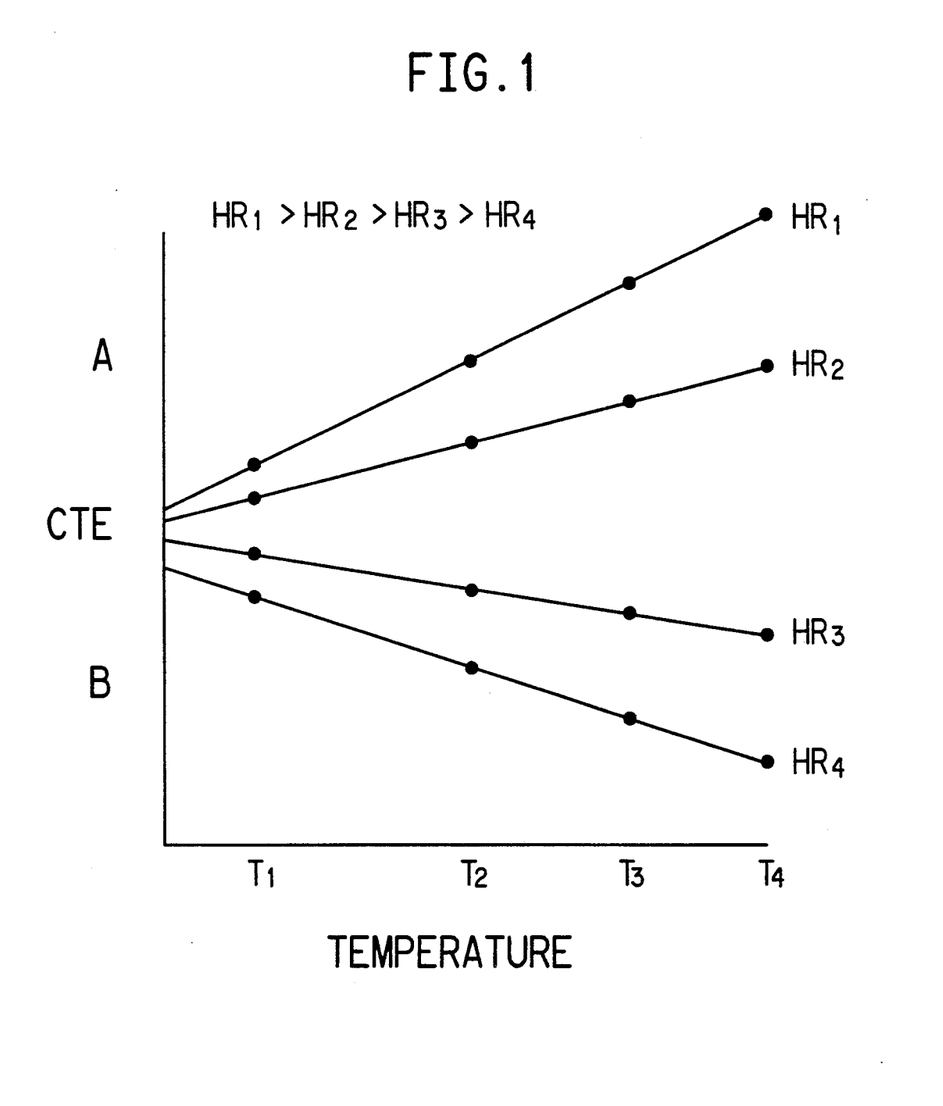
FIGS. 1, 1A and 1B are schematic cure graphs in which CTE is plotted vs. cure temperature for different cure heating rates.
Figure 1A:
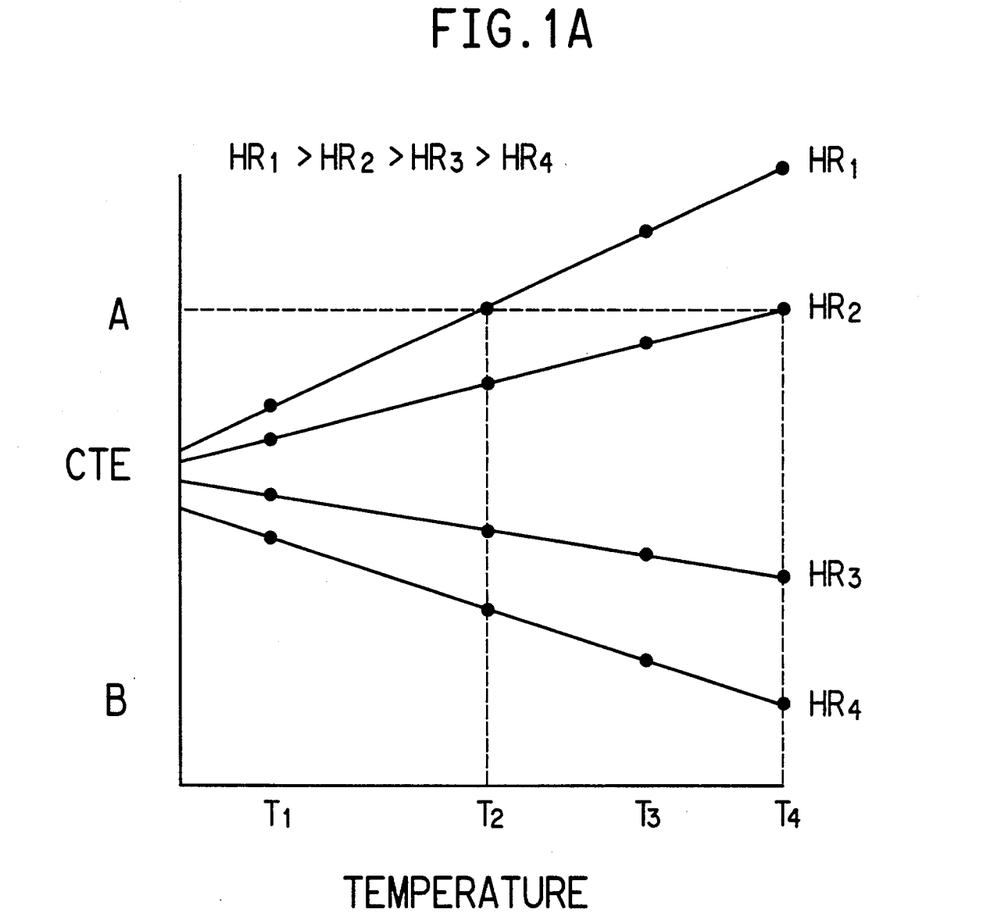
Figure 1B:
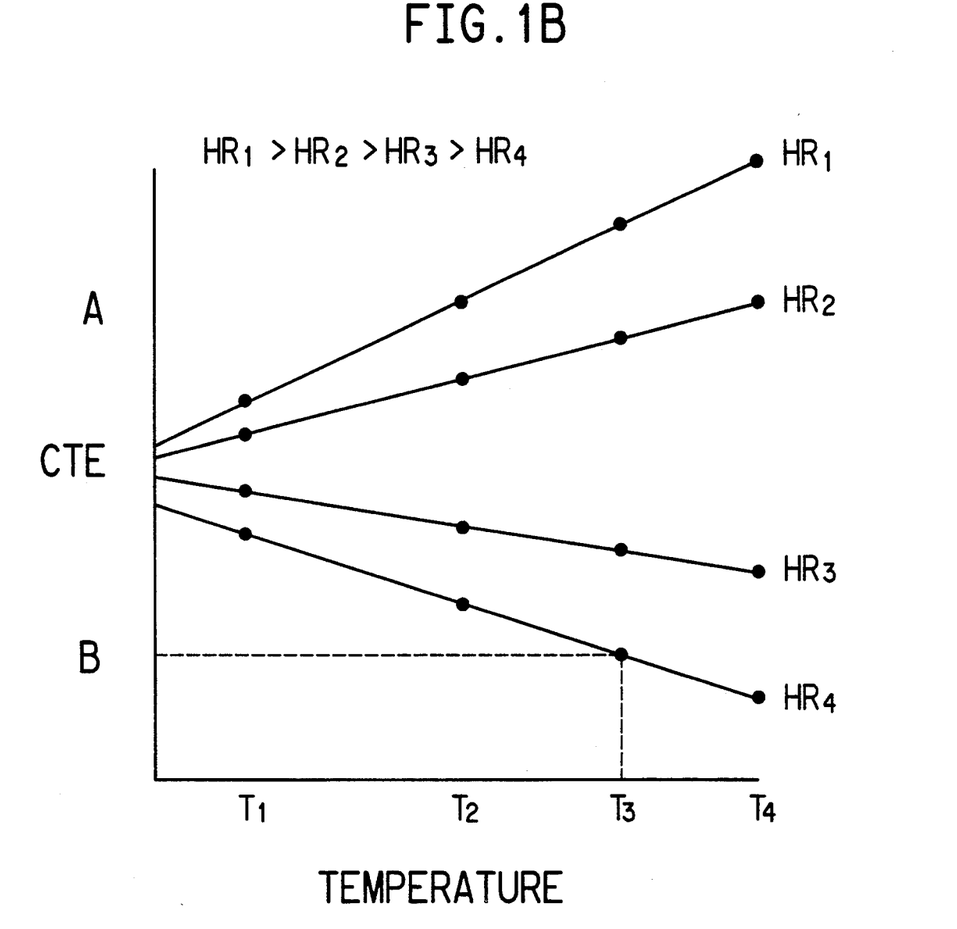

One way to determine the relationship between CTE and the cure or bake conditions is to construct a so-called "cure graph". To construct this graph, a given polyimide precursor, chosen according to the criteria discussed above, is used to prepare a first sample of polyimide film using a heating rate, $HR_1$, and a cure temperature, $T_1$. A second sample of polyimide film is prepared from the same composition using the same conditions and heating rate, but with a different cure temperature, $T_2$. Additional samples can be prepared using heating rate $HR_1$ and cure temperatures $T_3$, $T_4$, etc. This procedure is then repeated for heating rates $HR_2$, $HR_3$, $HR_4$, etc. The CTE is determined for each film sample. The data is then plotted as shown in FIG. 1. For each heating rate, the CTE values are plotted vs. the cure temperature and a curve is constructed through the points. It can then be determined from the cure graph, as shown in FIG. 1A, that in order to obtain a polyimide film having a CTE value of A using the given polyimide precursor, that a heating rate of $HR_1$ and cure temperature of $T_2$ can be used, or a heating rate of $HR_2$ and temperature of $T_4$ can be used. Similarly, as is shown in FIG. 1B, if it is desirable to prepare a polyimide film, using the given polyimide precursor, having a CTE value of B and using a cure temperature of $T_3$, it can be seen that the heating rate must be $HR_3$.

It is important to note that the polyimide composition and all of the processing conditions, other than the designed variation in cure conditions, must be kept constant when preparing the cure graph. Other process variables will also have an effect on the CTE, as will be discussed in further detail below.

For soluble polyimides, a "bake graph" can be constructed in a manner analogous to that for constructing the cure graph.

The heating rates for both bake and cure graphs generally can be as low as possible, but, for practical considerations based on the time required, generally have a lower limit of about 0.5°–2° C./min. The maximum heating rate is that obtained when the dried film (polyimide precursor or polyimide) is placed directly into a chamber at the cure or bake temperature or placed on a hot plate at the cure or bake temperature. The cure or bake temperatures which can be used range from the temperature at which imidization occurs to a temperature below the degradation temperature of the polyimide. Generally, a range of from 250° C. to 450° C. is acceptable.

Figure 2:
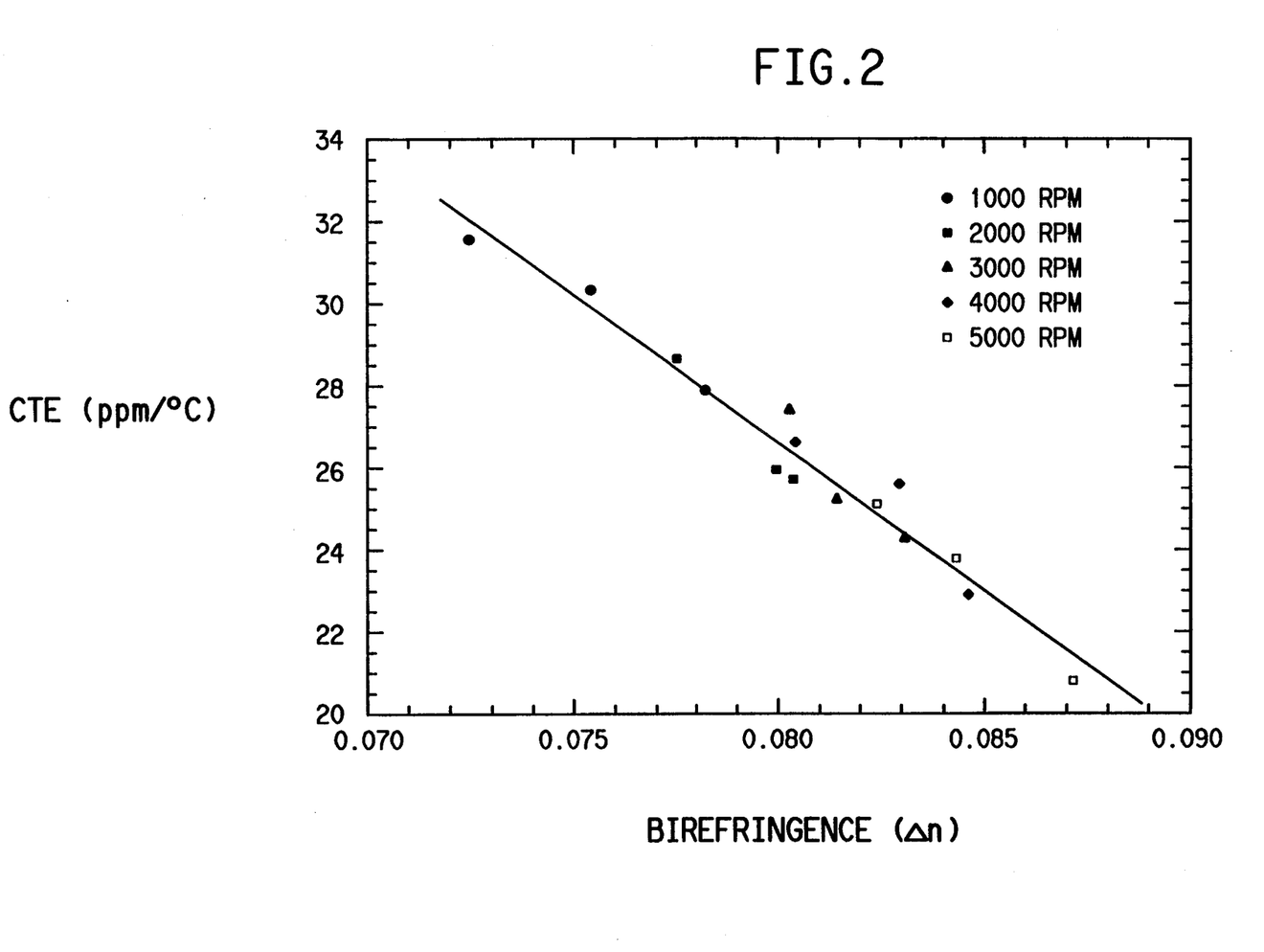
FIG. 2 is a graph of CTE vs. birefringence.

In some cases it may not be convenient to measure the CTE of the films directly, but rather to measure another property from which the CTE can be determined. Of particular interest is the birefringence, or change in index of refraction with direction. In FIG. 2, CTE is plotted vs birefringence. This Figure is the in-plane CTE vs. birefringence for spin coated PMDA-ODA. All of the PMDA-ODA film samples were spin coated at speeds ranging from 1 to 6 krpm, dried at 135° C. for 30 minutes and cured by heating at 2° C./minute to 200° C., holding at 200° C. for 30 minutes, heating at 2° C./minute to 200° C., holding at 200° C. for 30 minutes, heating at 2° C./minute to 350° C. and holding for one hour. It can be seen from the graph that the CTE can be calculated directly from the birefringence.

It is not necessary to formally construct a cure or bake graph in order to experimentally determine the relationship of CTE and the cure or bake conditions. If the CTE is known for a given polyimide composition at one set of cure or bake conditions, either experimentally determined or from the literature, an estimation of the cure or bake conditions necessary to produce the polyimide film with the desired value for CTE can be determined based on the most likely form of the cure or bake graph.

To prepare the final polyimide film a solution of the polyimide precursor or the imidized polymer is applied to a substrate, which may be the final desired substrate or a temporary substrate, i.e., removable. The film is dried to remove much of the solvent and reduce the surface tackiness, and then cured or baked. As was mentioned above, the CTE of the final polyimide film is also sensitive to other process variables during the formation of the final film.

The polyimide precursor solutions can be made generally as disclosed in U.S. Pat. Nos. 3,179,630 and 3,179,634. The tetracarboxylic acid component and the diamine component are dissolved together in a suitable solvent, and the resulting solution is agitated under controlled temperature conditions until polymerization of the tetracarboxylic acid component and diamine component is completed. The amount of solvent can be controlled so that the resulting polyimide precursor solutions are viscous enough to be fabricated into films by conventional techniques.

Suitable solvents for carrying out the polymerization reaction include, but are not limited to, polar organic solvents, such as sulfoxide type solvents including dimethylsulfoxide, diethylsulfoxide, and the like, formamide type solvents, such as N,N-dimethylformamide, N,N-diethylformamide; acetamide type solvents, including N,N-dimethylacetamide, N,N-diethylacetamide; pyrrolidone type solvents, including N-methyl-2-pyrrolidone, N-cyclohexyl-2-pyrrolidone, and 1,3-dimethyl-2-imidazolidinone; phenolic solvents, including phenols, cresols, xylenol, and catechol; hexamethylphosphoramide; and a number of lactones including butyrolactones. These solvents may be used alone or as a mixture. Partial use of aromatic hydrocarbons such as xylene and toluene, is also possible, and sometimes desirable, when, for example, removal of water as an azeotrope is desired.

For processing soluble polyimides, solvents such as tetrachloroethane and other halogenated solvents may be useful.

The next step in the preparation of the polyimide film is the application of the solution of polyimide precursor or soluble polyimide to a substrate. This is generally accomplished by solvent casting or spin coating techniques. Fabricating the film by spin coating generally results in films which have a lower and more isotropic CTE compared to the CTE of films that are prepared identically except that they are fabricated by solvent casting.

Figure 3:
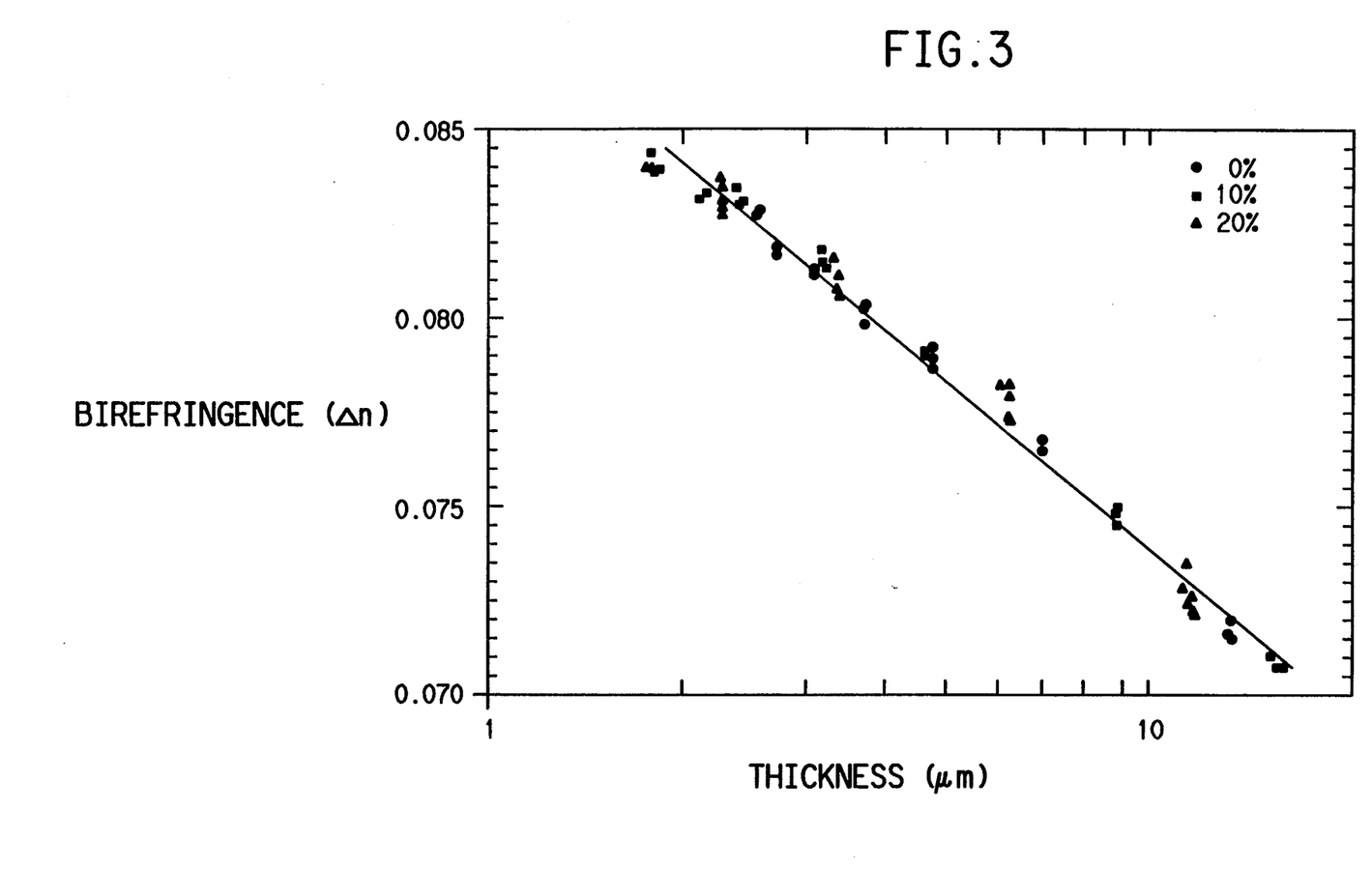
FIG. 3 is a graph of CTE vs. film thickness.

In addition to fabrication methods, the CTE also depends on the resulting film thickness. In spin coating the CTE will vary with spin speed, spin time and/or solids level in as much as they affect film thickness. FIG. 3 is the birefringence vs. final film thickness. The spinning conditions (i.e., spin speed, spin time, percent solids in solution) affect the in-plane birefringence and CTE only in as much as they affect the film thickness. The variation of CTE with film thickness is shown in this figure.

The applied film is next dried to remove much of the solvent and obtain a non-tacky surface. The drying temperature should be one at which a major portion of the solvent, i.e., greater than 50%, is removed without causing appreciable imidization. The amount of imidization occurring during the drying step should be less than 30 mole % and preferably less than 20 mole %. Excess imidization during the drying step can cause film blistering. The drying rate and drying temperature also have an effect on CTE, and thus must be carefully controlled.

The invention is further illustrated by, but not limited to, the following examples.

EXAMPLES

Abbreviations

BPDA: 3,3',4,4'-biphenyltetracarboxylic dianhydride
CHP: N-cyclohexyl-2-pyrrolidone
CTE: linear coefficient of thermal expansion
DAD: Diaminodurene
DMAc: Dimethylacetamide
DMSO: Dimethylsulfoxide
DSC: Differential scanning calorimetry
NMP: N-methyl-2-pyrrolidone
ODA: 4,4'-Diamino-diphenyl ether
PXDA: 9-Phenyl-9-trifluoromethylxanthene-2,3,6,7-dianhydride
PPD: p-Phenylene diamine
RH: Relative humidity
TCE: Tetrachloroethylene
$T_g$: Glass transition temperature
TGA: Thermogravimetric analyzer
THF: Tetrahydrofuran
TMA: Thermomechanical analyzer
Machine direction = direction in which the coating is applied Transverse direction = perpendicular to the machine direction.

The in-plane CTE was measured on the cured polyimide using a Perkin-Elmer TMA in extension mode with a force of 30 mN. The film was heated in the TMA to 220° C. for 30 minutes and cooled to 0° C. at a rate of 20° C./minute. The film was then reheated at 5° C./minute and the average linear expansion coefficient between 0° C. and 200° C. was calculated. Unless otherwise stated, all properties were measured in the machine direction.

Birefringence was calculated from the difference between in-plane and out-of-plane refractive indices. The in-plane and out-of-plane refractive indices were measured using Metricon 2010 integrated optics prism coupling technique. The measurements were made at a wavelength of 633 nm (He-Ne laser) and at ambient conditions of 55% RH and 22° C.

SOLUTION 1

BPDA/PPD Polyimide precursor

To a dry 4 liter resin kettle under nitrogen atmosphere was added BPDA (131.62 g, 447 mmol) and 1200 ml DMAc (dried over molecular sieves). PPD (80.63 g, 746 mmol) was added and the mixture was stirred until the solids were dissolved. A slurry of BPDA (78.98 g, 268 mmol) in dry DMAc (500 ml) was then added. When all solids were dissolved, aliquots of BPDA (2.19 g, 7.46 mmol) were added until the appropriate solution viscosity was achieved. A total of 8.44 g, 29.8 mmol was added; the Brookfield viscosity (25° C.) was 26,600 cps.

SOLUTION 2

BPDA/PPD-ODA (90–10) Polyimide Precursor

To a dry 4 liter resin kettle under nitrogen atmosphere was added BPDA (131.62 g, 447 mmol) and 1340 ml DMAC. PPD (72.57 g, 671 mmol) and ODA (14.93 g, 74.6 mmol) were added and the mixture was stirred until the solids were dissolved. A slurry of BPDA (78.98 g, 268 mmol) in dry DMAc (400 ml) was then added. When all solids were dissolved, aliquots of BPDA (2.19 g, 7.46 mmol) were added until the appropriate solution viscosity was achieved. A total of 8.44 g, 29.8 mmol, was added; the Brookfield viscosity (25° C.) was 78,000 cps.

SOLUTION 3

BPDA/PPD-ODA (80–20) Polyimide Precursor

To a dry 4 liter resin kettle under nitrogen atmosphere was added BPDA (131.62 g, 447 mmol) and 1378 ml DMAC. PPD (64.51 g, 597 mmol) and ODA (29.86 g, 149 mmol) were added and the mixture was stirred until the solids were dissolved. A slurry of BPDA (78.98 g, 268 mmol) in dry DMAc (400 ml) was then added. When all solids were dissolved, aliquots of BPDA (2.19 g, 7.46 mmol—last addition 1.09 g, 3.73 mmol) were added until the appropriate solution viscosity was achieved. A total of 7.68 g, 26.1 mmol, was added; the Brookfield viscosity (25° C.) was 16,200 cps.

SOLUTION 4

BPDA/PPD-ODA (80–20) Polyimide precursor

To a dry 2 liter resin kettle under nitrogen atmosphere was added ODA (9.53 g, 47.6 mmol) in NMP (400 ml). BPDA (33.96 g, 115.4 mmol) was added and the mixture was stirred until all the solids were dissolved. PPD (20.59 g, 190.4 mmol) was added in two equal portions and the mixture was stirred until the solids were dissolved. A slurry of BPDA (33.96 g, 115.4 mmol) in dry NMP (167 ml) was then added. When all solids were dissolved, four aliquots of BPDA (total 2.10 g, 7.1 mmol) were added over 2.5 hours until the appropriate solution viscosity was achieved.

SOLUTION 5

PXDA/DAD Soluble polyimide

Into a 100 ml reaction kettle fitted with a nitrogen inlet, mechanical stirrer, and a Dean-Stark trap with condenser, were charged 5.9162 g (12.687 mmol) of PXDA and 2.0838 g (12.687 mmol) DAD. Shortly thereafter, 44.8 ml of NMP and 11.2 ml of CHP were added and stirring was begun. The temperature was maintained at room temperature overnight (ca. 20 hours) under nitrogen, and then the following day, the reaction mixture was raised to a temperature of 180°–190° C. and maintained overnight (ca. 24 hours) to imidize the polymer. The polymer was diluted to about 8% solids with NMP and then isolated from the reaction solution by precipitation into methanol followed by drying under vacuum with a nitrogen bleed. Six grams of the dry polymer was dissolved in 94 ml of TCE.

SOLUTION 6

PXDA/ODA Soluble polyimide

Using the procedure for solution 5, a polymer was prepared from 5.5967 g (12.002 mmol) PXDA and 2.4033 g (12.002 mmol) ODA. The dried polymer was dissolved in TCE (ca. 8% solids, w/v).

SOLUTION 7

PXDA/DAD-ODA (60-40) Soluble polyimide

Using the procedure for solution 5, a polymer was prepared from 1.1041 g (6.7222 mmol) of DAD, 0.8973 g (4.4811 mmole) ODA and 5.2243 g (11.2033 mmol) of PXDA. The dried polymer was dissolved in TCE (ca. 8% solids, w/v).

EXAMPLES 1–4

These examples illustrate the effect of chain rigidity on CTE for a polyimide prepared from a film of a polyimide precursor.

The polyimide precursors in Solutions 1–4 were each applied to the roughened surface of a 1 oz rolled annealed copper foil such that the final cured thickness of the polyimide would be 25 micrometers. The coated foil was dried at 140° C. for 15 minutes in air in a convection oven. The dried films were then cured by heating at a heating rate of 2° C./min under nitrogen to 200° C. and holding at that temperature for 30 minutes, and then increasing the temperature at a rate of 2° C./min to 350° C. and holding for 60 minutes at that temperature, all under nitrogen. The cured polyimide film was removed from the copper in a solution consisting of 500 g ammonium persulfate and 25 g sulfuric acid in 1700 g water. The CTE was measured for each film and the results are given in Table 1.

TABLE 1

| Example | Solution | Solvent | ODA (mole %) | CTE (ppm/°C.) |
|---------|----------|---------|--------------|---------------|
| 1 | 1 | DMAc | 0 | 7 |
| 2 | 2 | DMAc | 10 | 14 |
| 3 | 3 | DMAc | 20 | 17 |
| 4 | 4 | NMP | 20 | 17 |

EXAMPLES 5–7

These examples illustrate the effect of chain rigidity on CTE for a soluble polyimide.

The soluble polyimides in Solutions 5–7 were each applied to 5-inch silicon wafers containing 1000 Å of thermally grown oxide, by spin coating at 3000 RPM for 30 seconds. After spin coating, the wafers were dried by immediately placing them in a convection oven at 135° C. for 30 minutes in air. The dried films were then baked by increasing the temperature at a rate of 2° C./min under nitrogen to 200° C. and holding at that temperature for 30 minutes, and then increasing the temperature at a rate of 2° C./min to 350° C. and holding at that temperature for 60 minutes, all under nitrogen. The baked polyimide films were removed from the wafer by dissolving the oxide layer in a buffered (6:1) HF bath. The CTE was measured for each film and the results are given in Table 2.

TABLE 2

| Example | Solution | DAD (mole %) | ODA (mole %) | CTE (ppm/°C.) |
|---------|----------|--------------|--------------|---------------|
| 5 | 5 | 100 | 0 | 3 |
| 6 | 6 | 0 | 100 | 51 |
| 7 | 7 | 60 | 40 | 12 |

EXAMPLES 8–9

These examples illustrate the effect of cure heating rate on CTE.

In Example 8 a solution of PMDA/ODA in NMP (Du Pont Pyralin® PI-2540) was applied to a 5-inch silicon wafer, dried and cured as described in Examples 5–7. The wafer was removed as in Examples 5–7 and the CTE measured.

In Example 9 the same PMDA/ODA solution was applied to a 5-inch silicon wafer and dried as described above. The dried films were cured by placing them directly into an oven preheated to 350° C. and holding for 60 minutes under nitrogen. The wafer was removed as in Examples 5–7 and the CTE measured.

The CTE for the sample which was heated with a slow heating rate, Example 8, was 20 ppm/°C. The CTE for the sample which was heated with a rapid heating rate, Example 9, was 42 ppm/°C.

EXAMPLES 10–13

These examples illustrate the effect of drying conditions on the CTE.

Using the polyimide precursor Solution 3, cured polyimide films were prepared as described in Examples 1–4 using the drying times and temperatures in the table below. The CTE was measured and the results are given in Table 3.

TABLE 3

| Example | Drying Temperature (°C.) | Drying Time (min) | CTE (ppm/°C.) |
|---------|--------------------------|-------------------|---------------|
| 10 | 130 | 15 | 20 |
| 11 | 140 | 15 | 17 |
| 12 | 150 | 7 | 15 |
| 13 | 150 | 10 | 20 |

These examples illustrate the importance of carefully controlling the drying conditions in preparing polyimide films.

EXAMPLES 14–15

These examples illustrate the effect of spin coating vs. solution casting on CTE.

In Example 14 a solution of PMDA/ODA in NMP (Du Pont Pyralin® PI-2540) was applied to a 5-inch silicon wafer, dried and cured as described in Examples 5–7 to a final thickness of approximately 10 micrometers. The wafer was removed as in Examples 5–7 and the CTE measured.

In Example 15 the same solution was applied to the roughened surface of a 1 oz rolled annealed copper foil such that the final cured thickness of the polyimide would be 10 micrometers. The films were dried and cured as described in Examples 1–4 and the CTE was measured.

When the polyimide precursor was spin coated, Example 14, the resulting CTE was 4 ppm/°C. in all directions. When the polyimide precursor was solution cast, Example 15, the resulting CTE was 8 ppm/°C. in the machine direction and 10 ppm/°C. in the transverse direction.

Having described the invention, the following and equivalents thereof are claimed.

What is claimed is:

1. A process for making a polyimide film having a preselected value for CTE, said process comprising the steps:
   (1) selecting a polyimide having a tetracarboxylic acid component and a diamine component according to the following criteria:
      (a) when the preselected value for CTE is less than about 20 ppm/°C., both a major portion of the tetracarboxylic acid component and a major portion of the diamine component are rigid;
      (b) when the preselected value for CTE is between about 20 and about 40 ppm/°C., a major portion of one of the components is rigid and a major portion of the other component is flexible;
      (c) when the preselected value for CTE is greater than about 40 ppm/°C., both a major portion of the tetracarboxylic acid component and a major portion of the diamine component are flexible;
   (2) preparing a polyimide precursor in a solution from the tetracarboxylic acid component and diamine component selected in step 1;
   (3) experimentally correlating the change in CTE with cure temperature for a polyimide film made from the precursor in step 2, to determine a relationship between CTE and cure temperature, for at least one preselected cure heating rate;
   (4) using said relationship to obtain a cure temperature and a heating rate for the polyimide film, and
   (5) preparing the polyimide film having the desired value for CTE from the polyimide precursor solution prepared in step 2 and using the cure temperature and the cure heating rate obtained in step 4.

2. The process of claim 1 wherein the relationship between CTE and cure temperature is determined for a plurality of preselected cure heating rates.

3. The process of claim 1 wherein the relationship between CTE and cure temperature is determined by preparing a cure graph for the polyimide film, said cure graph having values for CTE on the y-axis and values for cure temperature on the x-axis, said graph comprising a plurality of lines, each of which represents a different cure heating rate.

4. The process of claim 3 wherein the cure graph is constructed using the steps:
   (i) applying a solution of the polyimide precursor to a substrate to form a coating on the substrate;
   (ii) drying the coating;
   (iii) curing to effect imidization by increasing the temperature at a heating rate, to a final cure temperature, and heating at the final cure temperature for a time sufficient to result in substantially complete imidization;
   (iv) determining the CTE of the cured film from step 3;
   (v) repeating steps i–iv at least one time using the same heating rate and a different final cure temperature;
   (vi) placing the values obtained for CTE on the graph of CTE vs. final cure temperature and connecting the values with a curve which is extended back to the y-axis; and
   (vii) repeating steps i–vi at least one time using a different heating rate.

5. The process of claim 1 or 4 wherein the cure heating rate is discontinuous.

6. A process for making a polyimide film from a solution of a soluble polyimide polymer, said film having a preselected value for CTE, said process comprising the steps:
   (1) selecting a tetracarboxylic acid component and a diamine component to prepare the polyimide polymer, according to the following criteria:
      (a) when the preselected value for CTE is less than about 20 ppm/°C., both a major portion of the tetracarboxylic acid component and a major portion of the diamine component are rigid;
      (b) when the preselected value for CTE is between about 20 and about 40 ppm/°C., a major portion of one of the components is rigid and a major portion of the other component is flexible;
      (c) when the preselected value for CTE is greater than about 40 ppm/°C., both a major portion of the tetracarboxylic acid component and a major portion of the diamine component are flexible;
   (2) preparing a polyimide polymer from the tetracarboxylic acid component and diamine component selected in step 1;
   (3) preparing a solution of the polyimide from step 2;
   (4) experimentally correlating the change in CTE with bake temperature for a polyimide film made from the polyimide solution prepared in step 3, to determine a relationship between CTE and bake temperature, for at least one preselected bake heating rate;
   (5) using said relationship to obtain a bake temperature and a bake heating rate for the polyimide film, and
   (6) preparing the polyimide film having the desired value for CTE using the polyimide solution from step 3 and the bake temperature and bake heating rate obtained in step 5.

7. The process of claim 6 wherein the relationship between CTE and bake temperature is determined for a plurality of preselected bake heating rates.

8. The process of claim 6 wherein the relationship between CTE and bake temperature is determined by preparing a bake graph for the polyimide film, said bake graph having values for CTE on the y-axis and values for bake temperature on the x-axis, said graph comprising a plurality of lines, each of which represents a different bake heating rate.

9. The process of claim 8 wherein the bake graph is constructed using the steps:
   (i) applying a solution of soluble polyimide to a substrate to form a coating on the substrate;
   (ii) drying the coating;
   (iii) curing to effect solvent removal by increasing the temperature at a heating rate, to a final bake temperature, and heating at the final bake temperature for a time sufficient to result in substantially complete solvent removal;

(iv) determining the CTE of the baked film from step iii;

(v) repeating steps i–iv at least one time using the same heating rate and a different final bake temperature;

(vi) placing the values obtained for CTE on the graph of CTE vs. final bake temperature and connecting the values with a curve which is extended back to the y-axis; and (vii) repeating steps i–iv at least one time using a different heating rate.

10. The process of claim 6 or 9 wherein the bake heating rate is discontinuous.

* * * * *